US009263467B2

(12) United States Patent
Park et al.

(10) Patent No.: US 9,263,467 B2
(45) Date of Patent: Feb. 16, 2016

(54) THIN FILM TRANSISTOR ARRAY PANEL AND MANUFACTURING METHOD THEREOF

(71) Applicant: SAMSUNG DISPLAY CO., LTD., Yongin, Gyeonggi-Do (KR)

(72) Inventors: Sang Ho Park, Suwon-Si (KR); Yoon Ho Khang, Yongin-Si (KR); Se Hwan Yu, Seoul (KR); Yong Su Lee, Hwaseong-Si (KR); Chong Sup Chang, Hwaseong-Si (KR); Myoung Geun Cha, Seoul (KR); Hyun Jae Na, Seoul (KR)

(73) Assignee: SAMSUNG DISPLAY CO., LTD, Yongin, Gyeonggi-Do (KR)

( * ) Notice: Subject to any disclaimer, the term of this patent is extended or adjusted under 35 U.S.C. 154(b) by 0 days.

(21) Appl. No.: 14/466,665

(22) Filed: Aug. 22, 2014

(65) Prior Publication Data

US 2014/0361302 A1 Dec. 11, 2014

Related U.S. Application Data

(62) Division of application No. 13/559,931, filed on Jul. 27, 2012, now Pat. No. 8,846,514.

(30) Foreign Application Priority Data

Oct. 13, 2011 (KR) .......................... 10-2011-0104634

(51) Int. Cl.
*H01L 29/04* (2006.01)
*H01L 31/036* (2006.01)
(Continued)

(52) U.S. Cl.
CPC ...... *H01L 27/1214* (2013.01); *H01L 29/41758* (2013.01); *H01L 29/458* (2013.01); *H01L 29/78642* (2013.01); *H01L 29/78669* (2013.01); *H01L 29/78678* (2013.01)

(58) Field of Classification Search
CPC .................. H01L 27/1214; H01L 29/78642
USPC ........................................................... 257/57
See application file for complete search history.

(56) References Cited

U.S. PATENT DOCUMENTS

| 4,701,996 A | 10/1987 | Calviello |
| 4,924,279 A | 5/1990 | Shimbo |

(Continued)

FOREIGN PATENT DOCUMENTS

| JP | 02-192766 | 7/1990 |
| JP | 07-297406 | 11/1995 |

(Continued)

OTHER PUBLICATIONS

English Abstract for Publication No. 10-2005-0001936.

(Continued)

*Primary Examiner* — David S Blum
(74) *Attorney, Agent, or Firm* — F. Chau & Assciates, LLC

(57) ABSTRACT

A thin film transistor array panel according to an exemplary embodiment of the present disclosure includes: an insulating substrate; a gate electrode disposed on the insulating substrate; a gate insulating layer disposed on the gate electrode; a semiconductor disposed on the gate insulating layer; a source electrode and a drain electrode disposed on the semiconductor; an ohmic contact layer disposed at an interface between at least one of the source and drain electrodes and the semiconductor. Surface heights of the source and drain electrodes different, while surface heights of the semiconductor and the ohmic contact layer are the same. The ohmic contact layer is made of a silicide of a metal used for the source and drain electrodes.

9 Claims, 13 Drawing Sheets

(51) Int. Cl.
    *H01L 31/0376* (2006.01)
    *H01L 31/20* (2006.01)
    *H01L 27/12* (2006.01)
    *H01L 29/786* (2006.01)
    *H01L 29/417* (2006.01)
    *H01L 29/45* (2006.01)

(56) References Cited

U.S. PATENT DOCUMENTS

| | | |
|---|---|---|
| 6,320,221 B1 | 11/2001 | Choi et al. |
| 6,350,995 B1 | 2/2002 | Sung et al. |
| 6,620,719 B1 | 9/2003 | Andry et al. |
| 7,629,633 B2 | 12/2009 | Chan et al. |
| 2002/0001887 A1 | 1/2002 | Sung et al. |
| 2003/0207503 A1 | 11/2003 | Yamazaki et al. |
| 2004/0197964 A1 | 10/2004 | Lee et al. |
| 2006/0071211 A1 | 4/2006 | Lee |
| 2006/0175609 A1 | 8/2006 | Chan et al. |
| 2007/0096100 A1 | 5/2007 | Lee et al. |
| 2009/0218568 A1 | 9/2009 | Dairiki et al. |
| 2009/0224527 A1 | 9/2009 | Chin et al. |
| 2010/0051933 A1 | 3/2010 | Kim et al. |
| 2010/0133539 A1 | 6/2010 | Kang et al. |
| 2010/0155715 A1 | 6/2010 | Yun et al. |
| 2011/0068340 A1 | 3/2011 | Lee et al. |
| 2011/0101356 A1 | 5/2011 | Yamazaki |
| 2011/0121284 A1 | 5/2011 | Yamazaki et al. |
| 2011/0248268 A1 | 10/2011 | Dairiki et al. |

FOREIGN PATENT DOCUMENTS

| | | |
|---|---|---|
| KR | 100176179 | 11/1998 |
| KR | 1020000021376 | 4/2000 |
| KR | 10-2005-0001936 | 1/2005 |
| KR | 10-0658068 | 12/2006 |
| KR | 10-2007-0053029 | 5/2007 |
| KR | 10-2008-0075274 | 8/2008 |
| KR | 10-0852628 | 8/2008 |
| KR | 10-2010-0075059 | 7/2010 |

OTHER PUBLICATIONS

English Abstract for Publication No. 07-297406, Apr. 1994.
English Abstract for Publication No. 100176179, Nov. 1998.
English Abstract for Publication No. 10-0658068, Dec. 2006.
English Abstract for Publication No. 10-0852628, Aug. 2008.
English Abstract for Publication No. 1020000021376, Apr. 2000.
English Abstract for Publication No. 10-2007-0053029.
English Abstract for Publication No. 10-2008-0075274.
English Abstract for Publication No. 10-2010-0075059.
English Abstract for Publication No. 02-192766, Jul. 1990.

FIG. 13
(a)
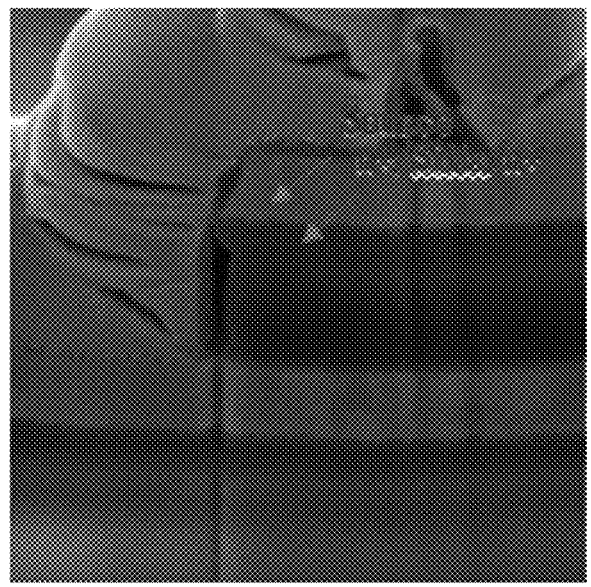
(b)
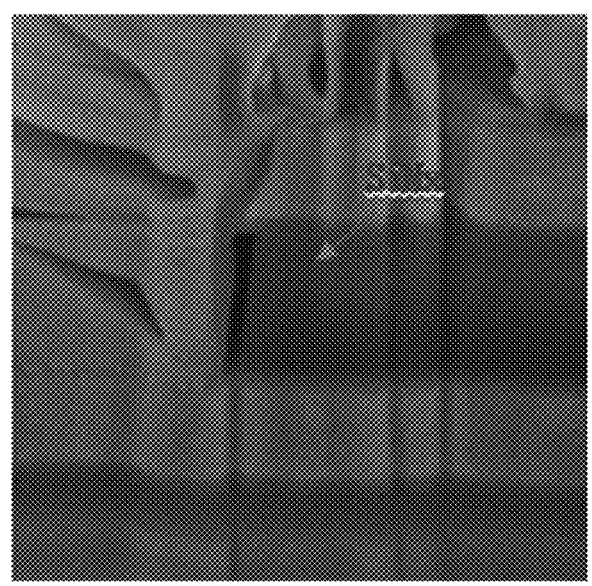

THIN FILM TRANSISTOR ARRAY PANEL AND MANUFACTURING METHOD THEREOF

CROSS-REFERENCE TO RELATED APPLICATIONS

This application is a divisional of, and claims priority from, U.S. patent application Ser. No. 13/559,931, now U.S. Pat. No. 8,846,514, filed on Jul. 27, 2012 in the U.S. Patent and Trademark Office, which in turn claims priority under 35 U.S.C.§119 from Korean Patent Application No. 10-201 1-0104634 filed in tile Korean Intellectual Property Office on Oct. 13, 2011, the entire contents of which are herein incorporated by reference in their entirety.

BACKGROUND (a) Technical Field

The present disclosure is directed to a thin film transistor array panel and a manufacturing method thereof.

(b) Description of the Related Art

In general, a thin film transistor array panel includes a gate electrode disposed on a substrate, a gate insulating layer disposed on the gate electrode, a semiconductor layer disposed on the gate insulating layer, a source electrode and a drain electrode disposed on the semiconductor layer and facing each other with respect to the gate electrode, and an ohmic contact disposed between the source electrode and drain electrode and the semiconductor layer.

In addition, a thin film transistor array panel typically includes a channel formed in the semiconductor layer between the source electrode and the drain electrode that is referred to as a horizontal channel.

An interval between the source electrode and the drain electrode has a minimum size that is determined by the resolution of the light exposer used to form the source electrode and the drain electrode in a photolithography process. Accordingly, reducing the length of the interval between the source electrode and the drain electrode to be less than the light exposer resolution is a challenge.

In addition, parasitic capacitance between the gate electrode and the source electrode and between the gate electrode and the drain electrode generated by an overlap between the source electrode and drain electrode and the gate electrode decreases an on-current of the thin film transistor.

Furthermore, the ohmic contact is made from an impurity-doped portion of the semiconductor layer that is formed under the source and drain electrodes, and forming the ohmic contact may damage the channel portion of the semiconductor layer.

SUMMARY

Exemplary embodiments of the present disclosure provide a thin film transistor array panel that reduces a channel length of a thin film transistor, prevents a reduction of an on-current due to parasitic capacitance between a gate electrode and a source electrode and drain electrode, and forms an ohmic contact between the source or drain electrodes and the semiconductor layer without damaging the semiconductor layer, and a manufacturing method thereof.

A thin film transistor array panel according to an exemplary embodiment of the present disclosure includes: a semiconductor; a source electrode and a drain electrode disposed on the semiconductor; and an ohmic contact layer disposed at an interface between at least one of the source and drain electrodes and the semiconductor, wherein surface heights of the source electrode and the drain electrode are different, and surface heights of the semiconductor and the ohmic contact layer are the same.

The ohmic contact layer may comprise a silicide of a metal used for the source electrode and the drain electrode.

The thin film transistor array panel may include a gate electrode disposed over an insulating substrate and under the semiconductor. At least one of the source electrode and the drain electrode fails to overlap the gate electrode.

The ohmic contact layer may include a first ohmic contact layer formed at an interface between the source electrode and the semiconductor layer, and a second ohmic contact layer formed at an interface between the drain electrode and the semiconductor layer.

The thin film transistor may further include a gate line connected to the gate electrode, a data line connected to the source electrode, and a pixel electrode connected to the drain electrode.

The thin film transistor may further include a gate insulating layer disposed between the gate electrode and the semiconductor.

A thin film transistor array panel according to another exemplary embodiment of the present disclosure includes: a source electrode and a drain electrode disposed on an insulating substrate that overlap each other with an insulating layer interposed therebetween; a semiconductor covering at least a side surface of the source electrode and the drain electrode; a gate electrode disposed on the semiconductor; and an ohmic contact layer disposed at an interface between at least one of the source electrode and the drain electrode, and the semiconductor, wherein surface heights of the semiconductor and the ohmic contact layer are the same.

The ohmic contact layer may comprise a silicide of a metal used for the source electrode and the drain electrode.

The source electrode and the drain electrode fail to overlap the gate electrode.

A method of manufacturing a thin film transistor array panel according to an exemplary embodiment of the present disclosure includes: forming a source electrode and a drain electrode on a semiconductor; and forming an ohmic contact layer at an interface between at least one of the source electrode and the drain electrode, and the semiconductor, after forming the source electrode and the drain electrode, wherein surface heights of the source electrode and the drain electrode are different, and surface heights of the semiconductor and the ohmic contact layer are the same.

The ohmic contact layer may be formed by annealing a metal for the source electrode and the drain electrode.

The method may further include forming a gate electrode on an insulating substrate. The gate electrode is under the semiconductor.

At least one of the source electrode and the drain electrode fails to overlap the gate electrode.

The method may further include forming a gate line connected to the gate electrode when forming the gate electrode, forming a data line connected to the source electrode when forming the source electrode, and forming a pixel electrode connected to the drain electrode.

The method may further include depositing a gate insulating layer on the gate electrode. The semiconductor is formed on the gate insulating layer.

The semiconductor and the source electrode and drain electrode may be simultaneously formed through one photolithography process.

A method of manufacturing a thin film transistor array panel according to another exemplary embodiment of the present disclosure includes: forming a source electrode and a drain electrode that overlap each other with an insulating layer interposed therebetween on an insulating substrate; forming a semiconductor covering a side surface of at least one of the source electrode and the drain electrode; forming a gate electrode on the semiconductor; and forming an ohmic contact layer at an interface between at least one of the source electrode and the drain electrode, and the semiconductor, wherein surface heights of the source electrode and the drain electrode are different.

In a thin film transistor array panel according to an exemplary embodiment of the present disclosure, the channel of the thin film transistor is formed in a vertical direction such that a length of the channel may be reduced, at least one of the source electrode and the drain electrode fails to overlap the gate electrode to reduce the on-current due to the parasitic capacitance between the source and drain electrodes and the gate electrode, and an ohmic contact layer made of silicide is formed at the interface between at least one of the source and drain electrodes and the semiconductor layer to form the channel to prevent damaging the semiconductor layer, the ohmic contact of the semiconductor layer, and the source and drain electrodes.

BRIEF DESCRIPTION OF THE DRAWINGS

FIGS. 13(a)-(b) show SEM photographs of a portion of a thin film transistor according to an experimental example of the present disclosure.

DETAILED DESCRIPTION OF EXEMPLARY EMBODIMENTS

Figure 1:
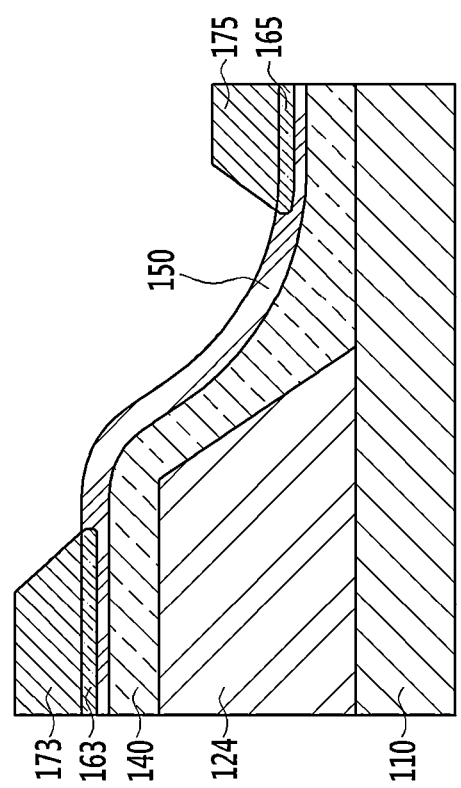
FIG. 1 is a cross-sectional view of a thin film transistor panel according to an exemplary embodiment of the present disclosure.

The present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

In the drawings, the thickness of layers, films, panels, regions, etc., may be exaggerated for clarity. Like reference numerals may designate like elements throughout the specification. It will be understood that when an element such as a layer, film, region, or substrate is referred to as being "on" another element, it can be directly on the other element or intervening elements may also be present.

FIG. 1 is a cross-sectional view of a thin film transistor panel according to an exemplary embodiment of the present disclosure.

Referring to FIG. 1, a gate electrode 124 is formed on an insulation substrate 110 made of transparent glass or plastic. The gate electrode 124 may be made of an aluminum-based metal such as aluminum (Al), an aluminum alloy, or the like, a silver-based metal such as silver (Ag), a silver alloy, or the like, a copper-based metal such as copper (Cu), a copper alloy, or the like, a molybdenum-based metal such as molybdenum (Mo), a molybdenum alloy, or the like, chromium (Cr), tantalum (Ta), or titanium (Ti). However, each of the gate conductors may have a multilayered structure that includes two conductive layers (not shown) having different physical properties. One of the conductive layers is made of a metal having low resistivity, such as aluminum, silver, copper, and so on, to reduce a signal delay or a voltage drop. Further, the other conductive layer is made of a material, such as molybdenum, chromium, thallium, titanium, and so on, having good physical, chemical, and electrical contact characteristics with other materials, such as indium tin oxide (ITO) and indium zinc oxide (IZO). Examples of such combinations include a chromium lower layer and an aluminum (alloy) upper layer, and an aluminum (alloy) lower layer and a molybdenum (alloy) upper layer. However, the gate electrode 124 can be made from other metals or electrical conductors, in addition to the above-described materials.

A gate insulating layer 140 is formed on the gate electrode 124. The gate insulating layer 140 can be made of silicon nitride (SiNx) or silicon oxide (SiOx).

A semiconductor 150 made of hydrogenated amorphous silicon (a-Si) or polysilicon is formed on the gate insulating layer 140.

A source electrode 173 and a drain electrode 175 are formed on the semiconductor 150 and the gate insulating layer 140. Surfaces of the source electrode 173 and the drain electrode 175 have different heights.

The source electrode 173 and the drain electrode 175 can be made of a refractive metal such as molybdenum, chromium, tantalum, or titanium, or alloys thereof, and can have a multilayer structure including a refractive metal layer (not shown) and a low-resistance conductive layer (not shown). The multilayer structure, for example, can be a double layer of a chromium or molybdenum (alloy) lower layer and an aluminum (alloy) upper layer, or a triple layer of a molybdenum (alloy) lower layer, an aluminum (alloy) intermediate layer, and a molybdenum (alloy) upper layer. However, the source and drain electrodes 173, 175 can be made from a variety of other metals and conductors.

A first ohmic contact layer 163 is formed in an interface between the source electrode 173 and the underlying semiconductor 150, and a second ohmic contact layer 165 is formed in the interface between the drain electrode 175 and the underlying semiconductor 150.

The thickness of each of the first ohmic contact layer 163 and the second ohmic contact layer 165 is almost equal to the thickness of the semiconductor 150, and the first and second ohmic contact layers 163, 165 are made from a silicide of the metal forming the source and drain electrodes 173, 175.

A channel of the thin film transistor according to a present exemplary embodiment is formed in the semiconductor 150 between the source electrode 173 disposed on the gate electrode 124 and the drain electrode 175 positioned along side of the gate electrode 124. The source and drain electrodes 173, 175 have different heights, and thus the channel is formed in the semiconductor 150 in a direction almost perpendicular to the surface of the substrate 110. That is, the thin film transistor according to a present exemplary embodiment has a vertical channel. Accordingly, the length of the vertical channel is determined by the height difference between the source and drain electrodes 173, 175, thereby forming a very short channel. As above described above, the thin film transistor panel according to an exemplary embodiment of the present disclosure has a vertical channel, thereby reducing the channel length.

In addition, at least one of the source and drain electrodes 173, 175 of the thin film transistor panel according to an exemplary embodiment of the present disclosure fails to overlap the gate electrode 124, reducing the on-current due to parasitic capacitance between the source and drain electrodes and the gate electrode.

Furthermore, the ohmic contact layer of the thin film transistor panel according to an exemplary embodiment of the present disclosure is formed by annealing after depositing the source and drain electrodes 173, 175 on the semiconductor layer to form a metal silicide, rather than a photolithography process after depositing an impurity-doped semiconductor layer, thereby realizing an ohmic contact between the semiconductor layer and the source and drain electrodes without damaging the semiconductor layer forming the channel.

Next, a manufacturing method of a thin film transistor panel according to an exemplary embodiment of the present disclosure will be described with reference to FIG. 2 to FIG. 7.

Figure 2:
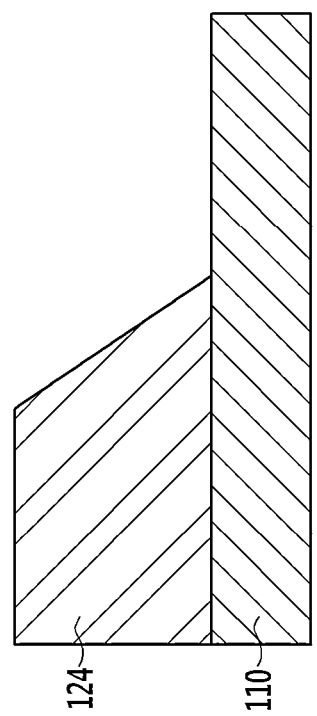
FIG. 2 to FIG. 7 are cross-sectional views showing a manufacturing process of the thin film transistor panel of FIG. 1.

Referring to FIG. 2, a gate electrode 124 is formed on an insulating substrate 110. The gate electrode 124 is formed by a photolithography process after depositing a first metal layer.

Figure 3:
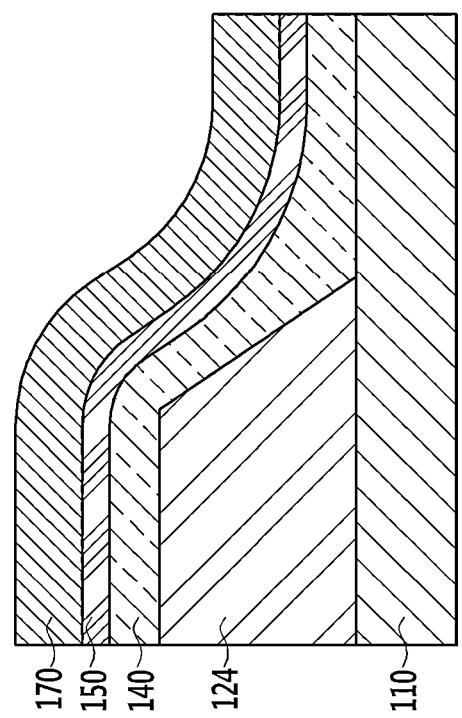

Referring to FIG. 3, a gate insulating layer 140, a semiconductor 150, and a second metal layer 170 are sequentially deposited on the insulating substrate 110 including the gate electrode 124.

Figure 4:
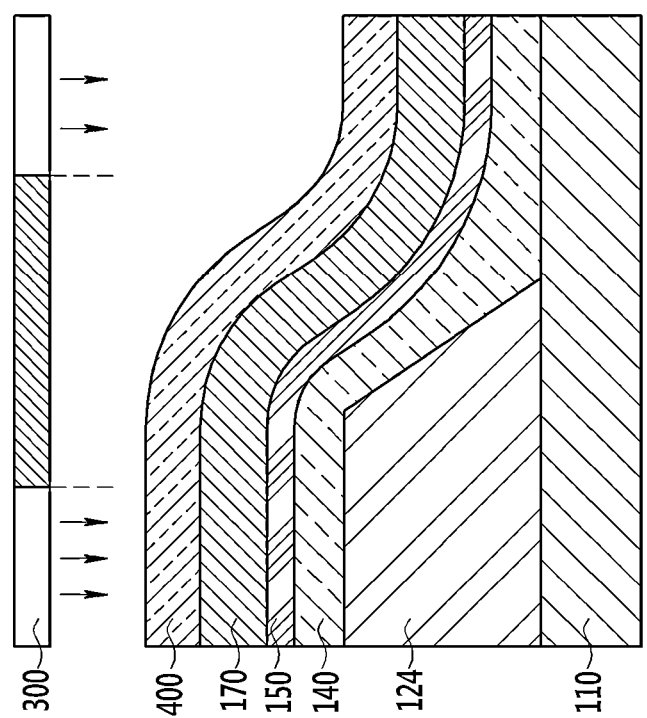
Figure 5:
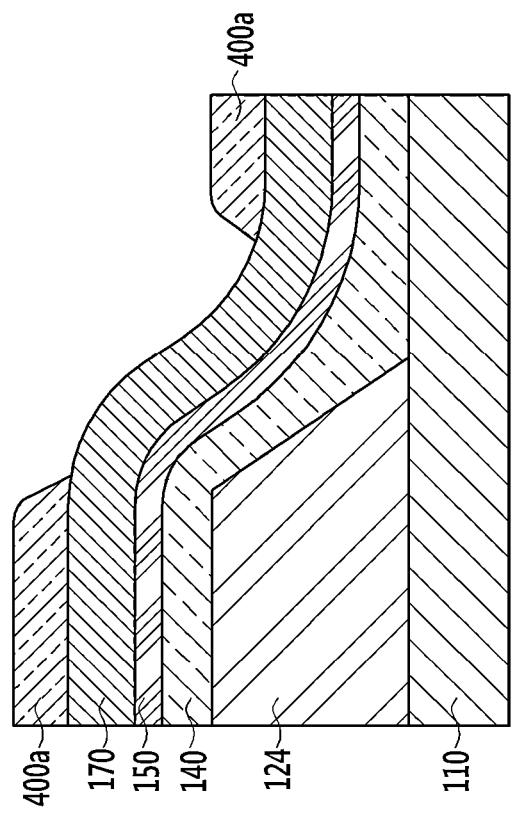

Referring to FIG. 4, a photosensitive film layer 400 is formed on the second metal layer 170 and is exposed using a photomask 300, and as shown in FIG. 5, a photosensitive film pattern 400a is formed at regions where the source and drain electrodes will be disposed.

Figure 6:
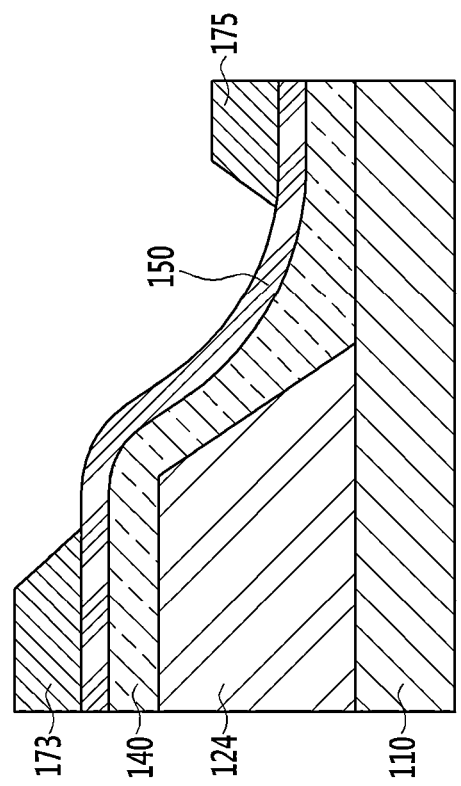

Referring to FIG. 6, the second metal layer 170 is etched using the photosensitive film pattern 400a as an etching mask to form the source electrode 173 and the drain electrode 175.

Here, the source and drain electrodes 173, 175 and the semiconductor 150 may be simultaneously formed by one photolithography process using one mask. In detail, a first photosensitive film pattern is formed on the semiconductor 150 and the second metal layer 170 having thicknesses that differ according to position. After the second metal layer 170 and the semiconductor 150 are etched using the first photosensitive film as the etching mask, the thickness of the first photosensitive film is reduced and the thinner portion of the first photosensitive film is removed to form a second photosensitive film pattern. Using the second photosensitive film pattern as the etching mask, the second metal layer 170 is etched to expose the semiconductor 150 to form a channel, thereby forming the source and drain electrodes 173, 175 and the semiconductor 150 through one photolithography process.

There are many methods of forming a photosensitive film with thicknesses differing according to location. One example includes forming a photomask with a translucent area as well as a light transmitting area and a light blocking area. The translucent area can be provided with a slit pattern or a lattice pattern, or can be a thin film having a medium transmittance or thickness. In the case a slit pattern, the slit width or the space between the slits may be smaller than the resolution of the exposure equipment used in the photolithography process. Another example includes using a reflowable photosensitive film. That is, a thin portion is formed by first forming a reflowable photosensitive film using a general exposure mask having only a light transmitting area and a light blocking area, and then making the photosensitive film flow into a region where the photosensitive film is not present. Since this reduces the number of photolithography processes, the manufacturing method is simplified.

Figure 7:
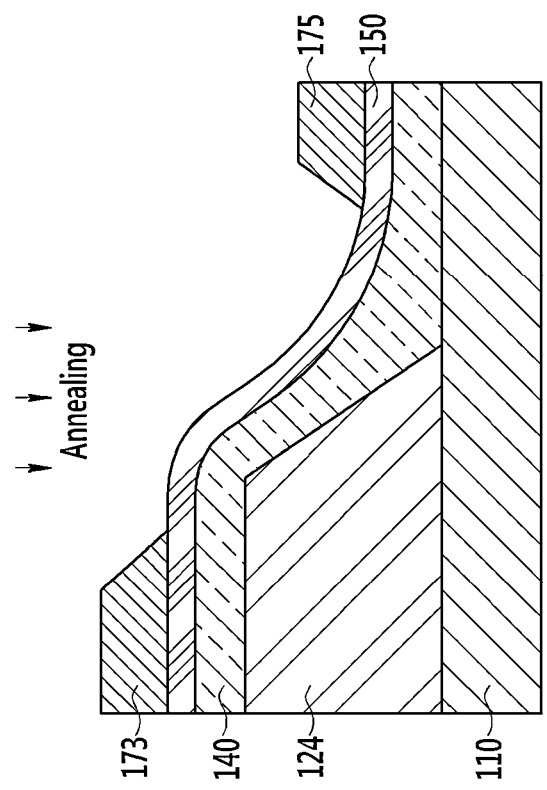

Referring to FIG. 7, by annealing the substrate 110 including the source and drain electrodes 173, 175, as shown in FIG. 1, ohmic contact layers 163 and 165 are formed in the interfaces between the source and drain electrodes 173, 175 and the semiconductor 150. An annealing temperature can be in a range of about 150° C. to about 600° C.

The process conditions for forming the ohmic contact layers 163 and 165 may differ according to the kind of metal layer. In detail, as shown in Table 1 below, the annealing temperature may change according to the kind of metal layer and the thickness thereof.

TABLE 1

| | Kind of a metal | | | | |
|---|---|---|---|---|---|
| | Nickel (Ni) | Titanium (Ti) | Copper (Cu) | Molybdenum (Mo) | Aluminum (Al) |
| Annealing temperature (° C.) | 230-660 | 200-600 | 500 and less than 500 | 200-600 | 157-355 |

According to exemplary embodiments, the thickness of nickel can be about 100 Å, the thickness of titanium can be about 300 Å, the thickness of copper can be about 100 Å, the thickness of molybdenum can be about 500 Å, and the thickness of aluminum can be about 100 Å.

As described above, the ohmic contact layer of the thin film transistor panel according to an exemplary embodiment of the present disclosure is formed by controlling the annealing conditions, and thereby the thin film transistor including the ohmic contact layer may have a desired on-current and off-current.

In this way, the ohmic contact layer of the thin film transistor panel according to an exemplary embodiment of the present disclosure is formed by annealing after depositing the source electrode 173 and the drain electrode 175 on the semiconductor layer to form a metal silicide, rather than by photolithography after depositing a semiconductor layer doped with an impurity, thereby realizing an ohmic contact between the semiconductor layer and the source and drain electrodes without damaging the semiconductor layer while forming the channel.

Figure 8:
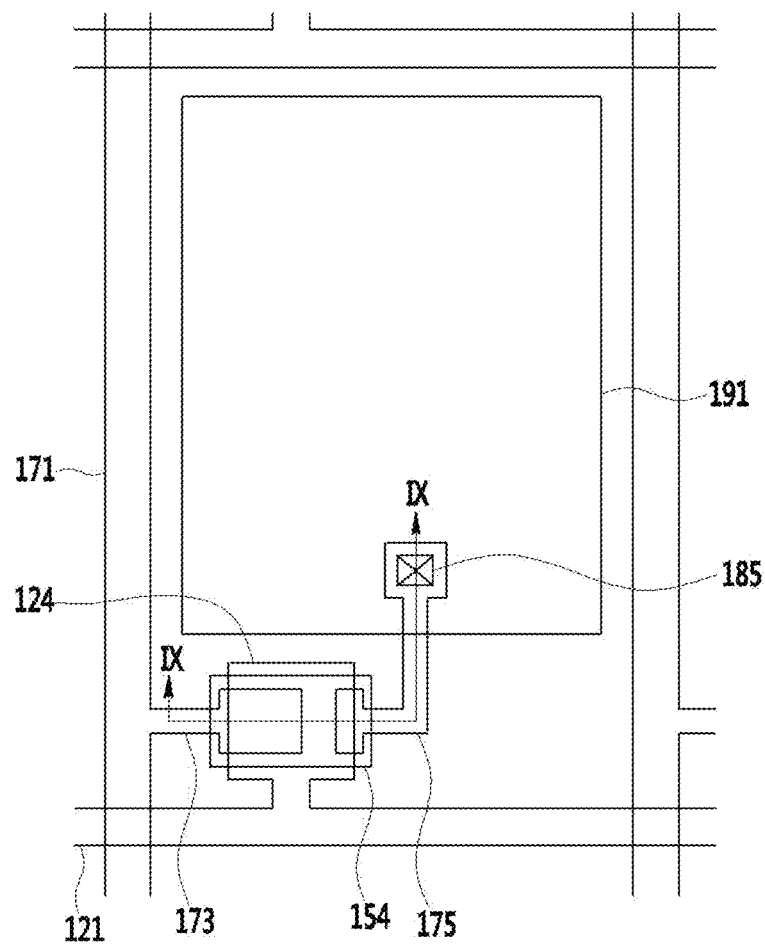
FIG. 8 is a layout view of a thin film transistor array panel according to an exemplary embodiment of the present disclosure.

Next, a thin film transistor array panel according to an exemplary embodiment of the present disclosure will be described with reference to FIG. 8 and FIG. 9. FIG. 8 is a layout view of a thin film transistor array panel according to an exemplary embodiment of the present disclosure, and FIG. 9 is a cross-sectional view of the thin film transistor array panel shown in FIG. 8 taken along the line IX-IX.

Figure 9:
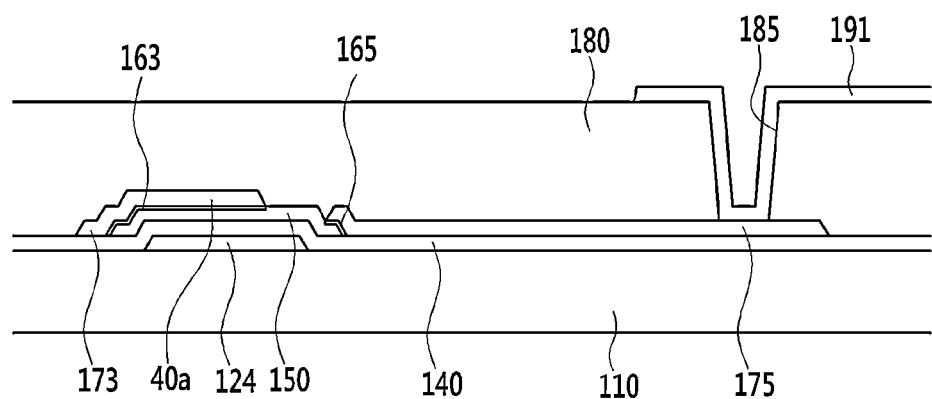
FIG. 9 is a cross-sectional view of the thin film transistor array panel of FIG. 8 taken alone the line IX-IX.

Referring to FIG. 8 and FIG. 9, a plurality of gate lines 121 including gate electrodes 124 are formed on an insulating substrate 110 made of transparent glass or plastic.

A gate insulating layer 140 made of silicon nitride is formed on the gate line 121 and the gate electrode 124. A plurality of semiconductors 150 made of hydrogenated amorphous silicon or polysilicon are formed on the gate insulating layer 140.

A plurality of data lines 171 including source electrodes 173 and a plurality of drain electrodes 175 are formed on the semiconductor 150 and the gate insulating layer 140. The data lines 171 transmit data signals and extend mainly in a longitudinal direction, thereby intersecting the gate lines 121. Each data line 171 includes a plurality of source electrodes 173 extending toward the gate electrodes 124.

The drain electrodes 175 are separated from the data lines 171.

The source and drain electrodes 173, 175 have different heights.

The first ohmic contact layer 163 is made of a silicide of the metal forming the source electrode 173 and is formed in the interface between the source electrode 173 and the underlying semiconductor 150. The second ohmic contact layer 165 is also made of a silicide of the metal forming the drain electrode 175 and is formed in the interface between the drain electrode 175 and the underlying semiconductor 150.

The surface heights of each of the first ohmic contact layer 163 and the second ohmic contact layer 165 are the same as the surface height of the semiconductor 150.

A passivation layer 180 is formed on the data lines 171 and drain electrodes 175 and the semiconductor 150. The passivation layer 180 can be made of an inorganic insulator such as silicon nitride or silicon oxide, an organic insulator, a low dielectric insulator, or the like.

The passivation layer 180 has a plurality of contact holes 185 exposing the drain electrodes 175.

A plurality of pixel electrodes 191 are formed on the passivation layer 180. The pixel electrodes 191 are physically and electrically connected to the drain electrodes 175 through the contact holes 185 and receive a data voltage from the drain electrodes 175. The pixel electrodes 191 to which the data voltage is applied generate an electric field in conjunction with a common electrode (not shown) of another array panel (not shown) to which a common voltage is applied, and the field determines a direction of liquid crystal molecules of a liquid crystal layer (not shown) between the two electrodes. The pixel electrode 191 and the common electrode form a capacitor, hereinafter referred to as "a liquid crystal capacitor", to maintain the applied voltage even after the thin film transistor is turned off.

The pixel electrode 191 can form a storage capacitor by overlapping a sustain electrode line (not shown), and thus strengthening the voltage-maintaining ability of the liquid crystal capacitor. The pixel electrode 191 can be made of a transparent conductor such as ITO or IZO.

As described above, the thin film transistor of a thin film transistor array panel according to an exemplary embodiment of the present disclosure has a vertical channel. Accordingly, the vertical channel length is determined by the height difference between the source electrode 173 and the drain electrode 175, thereby forming a short channel. As described above, the vertical channel of a thin film transistor array panel according to an exemplary embodiment of the present disclosure has a reduced length.

In addition, at least one of the source and drain electrodes 173, 175 of the thin film transistor array panel according to an exemplary embodiment of the present disclosure fails to overlap the gate electrode 124, reducing the on-current due to the parasitic capacitance between the source and drain electrodes and the gate electrode.

Furthermore, the ohmic contact layer of the thin film transistor array panel according to an exemplary embodiment of the present disclosure is formed by annealing after depositing the source and drain electrodes 173, 175 on the semiconductor layer to form a metal silicide, rather than by photolithography after depositing an impurity-doped semiconductor layer, thereby realizing an ohmic contact between the semiconductor layer and the source and drain electrodes without damaging the semiconductor layer forming the channel.

A thin film transistor panel according to another exemplary embodiment of the present disclosure will be described with reference to FIG. 10.

Figure 10:
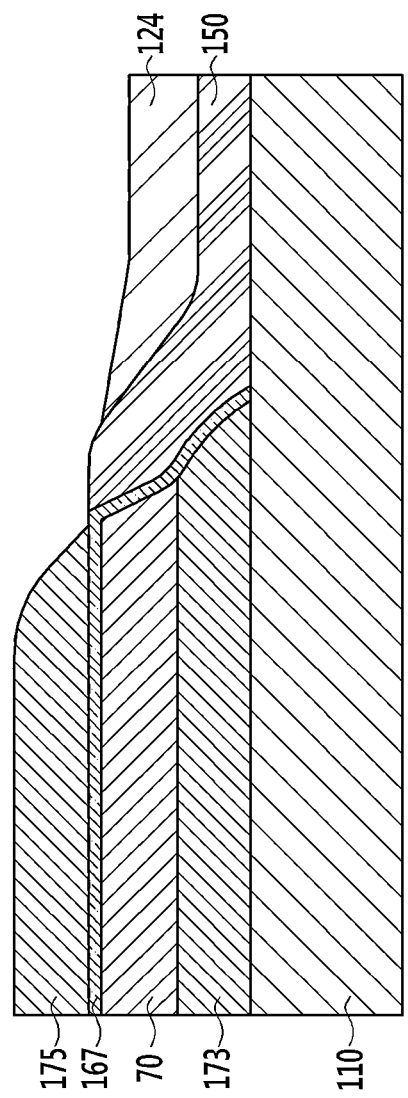
FIG. 10 is a layout view of a thin film transistor array panel according to another exemplary embodiment of the present disclosure.

Referring to FIG. 10, a source electrode 173 and a drain electrode 175 overlapping each other with an insulating layer 70 interposed therebetween are formed on an insulating substrate 110. A semiconductor 150 is formed along side of the source electrode 173 and the insulating layer 70, and a gate electrode 124 is formed on the semiconductor 150.

An ohmic contact layer 167 made from metal silicide is formed at the interface between the drain electrode 175 and the semiconductor 150. The ohmic contact layer 167 is made of the metal silicide at the interface between at least the source and drain electrodes 173, 175 and the semiconductor 150 by annealing after forming the source and drain electrodes 173, 175.

In this way, the thin film transistor of the thin film transistor panel according to an exemplary embodiment of the present disclosure has a vertical channel due to the source and drain electrodes 173, 175 overlapping each other. Accordingly, the length of the vertical channel of the thin film transistor is determined by the height difference between the source electrode 173 and the drain electrode 175, thereby forming a short length channel. As described above, the vertical channel of a thin film transistor panel according to an exemplary embodiment of the present disclosure has a reduced channel length.

In addition, the source and drain electrodes 173, 175 of the thin film transistor panel according to the present exemplary embodiment fail to overlap the gate electrode 124. Accordingly, the on-current due to the parasitic capacitance between the source electrode and drain electrode and the gate electrode can be reduced.

Furthermore, the ohmic contact layer of the thin film transistor panel according to an exemplary embodiment of the present disclosure is formed by annealing after depositing the source and drain electrodes 173, 175 to form the metal silicide, rather than by photolithography after depositing an impurity-doped semiconductor layer, thereby realizing an ohmic contact between the semiconductor layer and the source and drain electrodes without damaging the semiconductor layer forming the channel.

Figure 11:
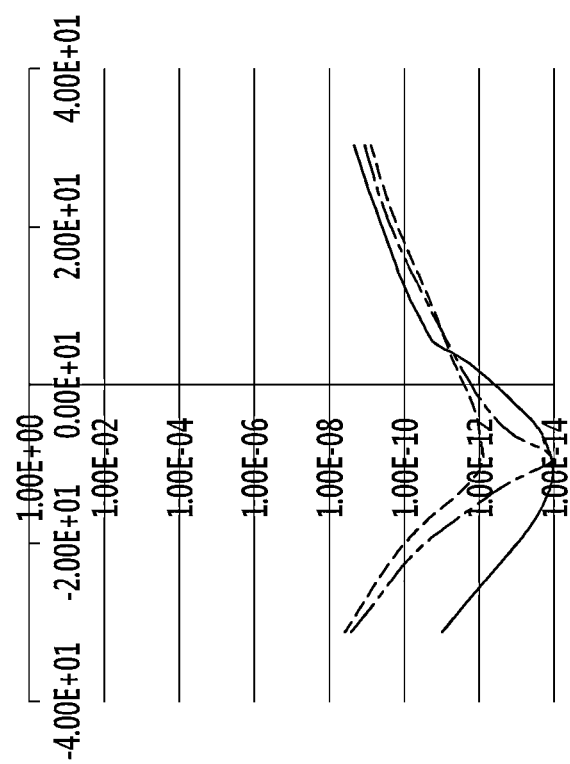
FIG. 11 and FIG. 12 are graphs of characteristic properties of a thin film transistor according to experimental examples of the present disclosure.
Figure 12:
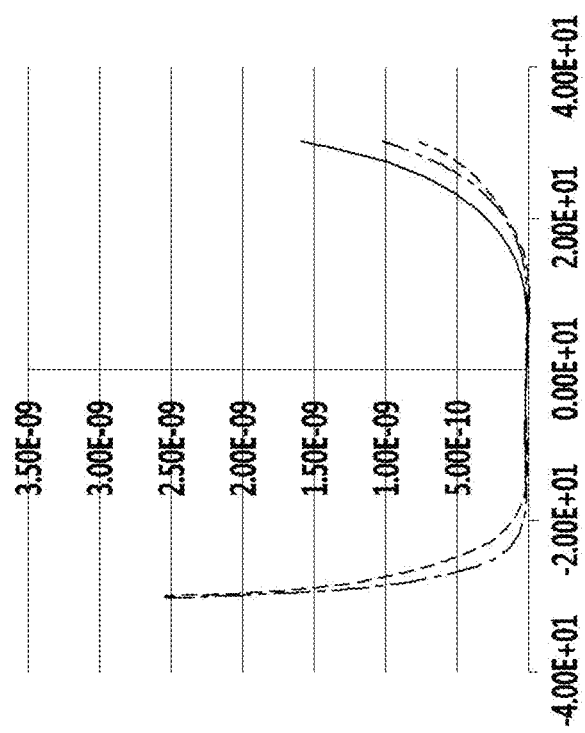

Properties of a thin film transistor according to experimental examples of the present disclosure will be described with reference to FIG. 11 and FIG. 12. FIG. 11 and FIG. 12 are graphs of characteristic properties of a thin film transistor according to experimental examples of the present disclosure.

In a present experimental example, the source electrode and the drain electrode are made of titanium, the annealing is performed while raising the temperature from about 300° C. to about 400° C. to form the ohmic contact layer, and a changing voltage is applied to the gate electrode to measure the current of the thin film transistor, results of which are shown in FIG. 11 and FIG. 12. In FIG. 11 and FIG. 12, the horizontal axis represents the voltage applied to the gate electrode, and the vertical axis represents a current value of the thin film transistor.

Referring to FIG. 11, it may be confirmed that an off-current value of the thin film transistor is sufficiently small in magnitude to be capable of being used as a switching element.

Referring to FIG. 12, it may be confirmed that an on-current value of the thin film transistor is sufficiently increased in magnitude to be capable of being used as a switching element.

Next, contact properties between a semiconductor and the source and drain electrodes of a thin film transistor of an experimental example of the present disclosure will be described with reference to FIGS. 13(a)-(b). FIGS. 13(a)-(b) show scanning electron microscope (SEM) photographs of a portion of a thin film transistor according to an experimental example of the present disclosure.

The photo of FIG. 13(a) shows an ohmic contact layer formed using an impurity-doped silicon layer, and the photo of FIG. 13(b) shows an ohmic contact layer formed using a metal silicide of the source or drain electrodes of a thin film transistor panel according to an exemplary embodiment of the present disclosure. Referring to FIG. 13(a), the ohmic contact layer is formed and a lower surface of the source electrode is irregular, however, in FIG. 13(b), when the ohmic contact layer is formed using the metal silicide of the source or drain electrodes, the interface along the source electrode has a substantially uniform surface. Accordingly, in a thin film transistor panel according to an exemplary embodiment of the present disclosure, when the ohmic contact layer is formed using metal silicide of the source or drain electrodes, the contact properties between the semiconductor layer and the source or drain electrodes with an ohmic contact layer interposed therebetween are improved.

A thin film transistor panel according to an exemplary embodiment has a predetermined structure including a gate electrode, a semiconductor, a source electrode, and a drain electrode as one example, however the present disclosure is not limited thereto, and many characteristics of the present disclosure may be applied to thin film transistors of thin film transistor panels having a vertical channel.

While this disclosure has been described in connection with what is presently considered to be practical exemplary embodiments, it is to be understood that the disclosure is not limited to the disclosed embodiments, but, on the contrary, is intended to cover various modifications and equivalent arrangements included within the spirit and scope of the appended claims.

What is claimed is:

1. A thin film transistor panel comprising:
a substrate;
a semiconductor disposed on the substrate;
a source electrode and a drain electrode disposed on the substrate and overlapping the semiconductor; and
an ohmic contact layer disposed at an interface between at least one of the source electrode and the drain electrode, and the semiconductor,
wherein a distance between a surface of the substrate and a surface of the source electrode and a distance between the surface of the substrate and a surface of the drain electrode are different,
the ohmic contact layer includes a first ohmic contact layer formed at an interface between the source electrode and the semiconductor layer and a second ohmic contact layer formed at an interface between the drain electrode and the semiconductor layer, and
a distance between the surface of the substrate and a surface of the first ohmic contact layer and a distance between the surface of the substrate and a surface of the second ohmic contact layer are different.

2. The thin film transistor panel of claim 1, wherein the ohmic contact layer comprises a silicide of a metal used for the source electrode and the drain electrode.

3. The thin film transistor array panel of claim 1, further comprising a gate electrode disposed over an insulating substrate and under the semiconductor, wherein at least one of the source electrode and the drain electrode does not overlap the gate electrode.

4. The thin film transistor panel of claim 3, further comprising:
a gate line connected to the gate electrode;
a data line connected to the source electrode; and
a pixel electrode connected to the drain electrode.

5. The thin film transistor panel of claim 3, further comprising a gate insulating layer disposed between the gate electrode and the semiconductor.

6. A thin film transistor panel comprising:
a substrate;
a source electrode and a drain electrode disposed on the substrate, the source electrode and the drain electrode that overlap each other with an insulating layer interposed therebetween;
a semiconductor covering at least a side surface of the source electrode and the drain electrode;
a gate electrode disposed on the semiconductor; and
an ohmic contact layer disposed at an interface between at least one of the source electrode and the drain electrode, and the semiconductor,
wherein a distance between the surface of the substrate and a surface of the source electrode and a distance between the surface of the substrate and a surface of the drain electrode are different.

7. The thin film transistor panel of claim 6, wherein the ohmic contact layer comprises a silicide of a metal used for the source electrode and the drain electrode.

8. The thin film transistor panel of claim 7, wherein
a distance between the surface of the substrate and a surface of the gate electrode and a distance between the surface of the substrate and a surface of the source electrode are different, and
a distance between the surface of the substrate and the surface of the gate electrode and a distance between the surface of the substrate and a surface of the drain electrode are different.

9. The thin film transistor panel of claim 7, further comprising:
a gate line connected to the gate electrode;
a data line connected to the source electrode; and
a pixel electrode connected to the drain electrode.

* * * * *